US007582707B2

(12) United States Patent
Robeson et al.

(10) Patent No.: US 7,582,707 B2
(45) Date of Patent: Sep. 1, 2009

(54) AQUEOUS BLENDS AND FILMS COMPRISING A FIRST ELECTRICALLY CONDUCTING CONJUGATED POLYMER AND A SECOND ELECTRICALLY CONDUCTING CONJUGATED POLYMER

(75) Inventors: Lloyd Mahlon Robeson, Macungie, PA (US); Xuezhong Jiang, Fogelsville, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 600 days.

(21) Appl. No.: 10/755,633

(22) Filed: Jan. 12, 2004

(65) Prior Publication Data

US 2005/0154119 A1 Jul. 14, 2005

(51) Int. Cl.
C08G 75/06 (2006.01)
C08G 73/06 (2006.01)
C08L 81/00 (2006.01)
C08L 79/04 (2006.01)

(52) U.S. Cl. .................. 525/535; 525/417; 525/540; 525/416; 525/241; 525/203; 525/206; 525/211

(58) Field of Classification Search ................. 525/535, 525/540, 416, 206, 203, 212, 539, 417, 240; 428/690, 515
See application file for complete search history.

(56) References Cited

U.S. PATENT DOCUMENTS

| 5,518,767 | A | * | 5/1996 | Rubner et al. ............... 427/259 |
| 5,567,355 | A | | 10/1996 | Wessling et al. |
| 5,736,623 | A | | 4/1998 | Angelopoulos et al. |
| 5,812,367 | A | * | 9/1998 | Kudoh et al. ................ 361/523 |
| 6,037,712 | A | * | 3/2000 | Codama et al. ............. 313/498 |
| 6,235,414 | B1 | * | 5/2001 | Epstein et al. .............. 428/690 |
| 6,611,096 | B1 | | 8/2003 | McCormick et al. |
| 6,723,828 | B2 | * | 4/2004 | Pei ............................ 528/422 |
| 6,787,007 | B2 | * | 9/2004 | Lessing ...................... 204/242 |
| 2003/0010959 | A1 | * | 1/2003 | Lee et al. .................... 252/500 |

FOREIGN PATENT DOCUMENTS

| JP | 2-212557 | * | 8/1990 |
| JP | 02-212557 | A | 8/1990 |
| JP | 2-212557 | A | 8/1990 |
| JP | 08-231863 | A | 9/1996 |
| JP | 8-231863 | A | 9/1996 |
| JP | 2001-223076 | A | 8/2001 |
| JP | 2003-045667 | A | 2/2003 |
| JP | 2003-509816 | A | 3/2003 |
| JP | 2004-263110 | A | 9/2004 |
| KR | 10-2003-0014811 | * | 2/2003 |

WO 01/99192 A2 12/2001

OTHER PUBLICATIONS

Yang et al. Appl. Phys. Lett., 1996, 68(19), 2708-2710.*
Chung et al. Appl. Phys. Letts. 1999, 24, 3645-3647.*
Oh et al., KR 2003-014811 (Feb. 20, 2003); abstract.*
Oh et al. (KR 2003-014811, Feb. 20, 2003) translation in English.*
Akundy et al., J. Appl. Polym. Sci., 2002, 83, 1970-1977.*
Sakkopoulos et al., J. Mater. Sci., 2002, 37, 2865-2869.*
Zhao et al., Polymer Gels and Networks, 1998, 6, 233-245.*
Tanaka et al., Thin Solid Films 2006, 499, 179-184.*
Seshadri et al., Langmuir 2003, 19, 9479-9485.*
Bai et al., Polymer 2007, 48, 4015-4020.*
Berggren et al., Nature 1994, 372 (Dec. 1), 444-446.*
JP2-212557 (Aug. 23, 1999) Kiyohara et al.; translation in English.*
H. Shirakawa, et al, Synthesis of Electrically Conducting Organic . . . , F. Chem. Soc., Chem. Commun., 1977, p. 578-580.
C.K. Chiang, et al, Electrical Conductivity in Doped Polyacetylene, Phys. Rev. Lett., 1977, p. 1098-1101, 39.
C.K. Chiang, et al, Synthesis of Highly Conducting Films of Derivatives . . . , J. Am. Chem., Soc., 1978, p. 1013-1015, 100.
H. Naarmann, et al, New Process for the Production of Metal-Like . . . , Syn. Metals, 1987, p. 1-8, 22.
J. Tsukamoto, Recent Advances in Highly Conductive Polyacetylene, Adv. in Phys., 1992, p. 509-546, 41.
Y.W. Park, et al, Metallic Temperature Dependence of Resistivity in . . . , Syn. Metals, 1998, p. 81-86, 96.
R. Menon, et al, Metal-Insulator Transition in Doped Conducting Polymers, Insti. for Poly. and Org. Solids, Univ. of CA S.B., 1998, p. 27-84.
K. Vakiparta, et al, Temperature Dependence of the Electrical Conductivity . . . , Phys. Rev. B, 1993, p. 9977-9980, 47, No. 15.
M. Ahlskog, et al, The Temperature Dependence of the Conductivity . . . , J. Phys. Condens. Matter 9, 1997, p. 4145-4156.
Y. Cao, et al, Counter-ion Induced Processibility of Conducting Polyaniline . . . , Syn. Met., 1992, p. 91-97, 48.
A.G. MacDiarmid, et al, The Concept of Secondary Doping as Applied to Polyaniline, Syn. Metals, 1994, p. 103-116, 65.
J.B. Schlenoff, et al, Chemical and Electrochemical Doping in Poly . . . , J. Polymer Sci., Part B: Poly. Phy., 1988, p. 2247-2256, 26.
S.H. Kim, et al, Effect of Dopant Mixture on the Conductivity and Therma . . . , J. Appl. Sci., 2002, p. 2245-2254, 83.

(Continued)

*Primary Examiner*—David Wu
*Assistant Examiner*—Rip A. Lee
(74) *Attorney, Agent, or Firm*—Michael K. Boyer

(57) ABSTRACT

An aqueous blend comprising water, a first conjugated polymer having a conductivity of greater than $10^{-7}$ S/cm and a second conjugated polymer having a conductivity greater than $10^{-7}$ S/cm wherein the conductivities of the first conjugated polymer and the second conjugated polymer are measured using a four point probe method prior to preparing the aqueous blend. A film is also presented comprising a first conjugated polymer having a conductivity of greater than $10^{-7}$ S/cm and a second conjugated polymer having a conductivity greater than $10^{-7}$ S/cm formed by (a) depositing the recited aqueous blend onto an article and (b) removing the water-containing solution to form the film on the article.

19 Claims, 4 Drawing Sheets

OTHER PUBLICATIONS

Y. Cao, et al, Solution-cast Films of Polyaniline: Optical-quality Transparent Electrodes, Appl. Phys. Lett. 60, 1992, p. 2711-2713, 22.

C.Y. Yang, et al, Morphology of Conductive, Solution-Processed Blends of . . . , Syn. Metals, 1993, p. 293-301, 53.

E. Segal, et al, Polyaniline/PVAc Blends: Variation with Time of Structure . . . , J. Appl. Poly. Sci., 2001, p. 760-766, 79.

S. Sakkopoulos, et al, Electrical Conductivity and TSDC Study of the Thermal . . . , J. Mat. Sci., 2002, p. 2865-2869, 37.

G.S. Akundy, et al, Electrochemical Depositions of Polyaniline-Polypyrrole . . . , J. Appl. Poly. Sci., 2002, p. 1970-1977, 83.

M.-A. DePaoli, et al, Conductive Polymer Blends: Preparation, Properties and Applications, Macromol. Symp. 189, 2002, p. 83-103.

S.K.M. Jonsson, et al, The Effects of Solvents on the Morphology and Sheet . . . , Syn. Met. 10361, 2003, p. 1-10.

A.N. Papathanassiou, et al, Effect of Hydrostatic Pressure on the D.C. Conductivity of Fresh . . . , J. Phys. D: Appl. Phys. 35, 2002, p. L85-L86.

Sandman, Daniel J.; "Conjugated Polymers (Insulating and Conducting Forms);"(Polymeric Materials Encyclopedia); vol. 2; ERC Press; 1996; pp. 1468-1480.

MacDiarmid, Alan G.; "Synthetic Metals: A Novel Role for Organic Polymers (Nobel Lecture);" Angew. Chem. Int. Ed; (2001); pp. 2581-2590.

Kim, Ji-Seon et al; "Spin-cast thin semiconducting polymer interlayer for improving device efficiency of polymer light-emitting diodes;" (Applied Physics Letters 87, 023605 (2005).

K Lee, et al; "Poly(thieno(3,4-b)thiophene). A New Stable Low Band Gap Conducting Polymer;" Macromolecules 2001, 34, 5746-5747.

K. Lee et al; "Toward the Useo f Poly(Thieno(3,4-b)Thiophene) In Optoelectronic Devices;" Polymer Preprints 2002; 43(2), 610-611.

K. Lee et al; "Ion Transport Behavior Of Polymers and Copolymers Containing Thieno(3,4-b)Thiophene;" Polymer Preprints 2002, 43(2), 584-585.

G. Sotzing et al; Poly(thieno(3,4-b)thiophene): A p- and n-Dopable Polythiophene Exhibiting High Optical Transparency in the Semiconducting State; Macromolecules 2002, 35, 7281-7286.

V. Seshadri et al; Conjugated Polymers via Electrochemical Polymerization of Thieno (3,4-b)thiophene (T34bT) and 3,4-Ethylenedioxythiophene (EDOT), Langmuir 2003, 19, 9479-9485.

* cited by examiner

-□- PTT:PSSA
-■- (PEDOT:PSSA) : (PTT:PSSA)
-◇- PEDOT:PSSA
-○- NONE

AQUEOUS BLENDS AND FILMS COMPRISING A FIRST ELECTRICALLY CONDUCTING CONJUGATED POLYMER AND A SECOND ELECTRICALLY CONDUCTING CONJUGATED POLYMER

BACKGROUND OF THE INVENTION

This invention relates to aqueous blends comprising at least two electrically conducting conjugated polymers and films formed from such aqueous blends. The blends and films are well suited for use in a variety of applications including but not limited to fabricating the hole injection/transporting layer of photovoltaic devices and electroluminescent devices.

Conjugated polymers were initially observed to exhibit electrical conductivity by Shirakawa et al., F. Chem. Soc., Chem. Commun. P.578 (1977); Chiang et al., Phys. Rev. Lett., 39, 1098 (1977); and Chiang et al., J. Am. Chem. Soc., 100,1013 (1978). The researchers observed that poly(acetylene) yielded an electrically conducting polymer when doped with an oxidizing or a reducing agent. The conjugated polymer as oxidized is electron deficient (positively charged) and thus neutralized with an anion (the reverse situation with reducing agent doping). Once recognized that the conjugation existing in poly(acetylene) had similarities to many other conjugated polymers, a major research effort was initiated.

Other conjugated polymers that exhibit electrically conducting properties upon being doped include poly(thiophenes), poly(anilines), poly(pyrroles), poly(phenylenes), poly(phenylene vinylenes) (PPV), poly(thienyl vinylenes) and poly(phenylene sulfides). The conductivities of undoped conjugated polymers are generally in the range of $10^{-7}$ to $10^{-10}$ S/cm (i.e., in the semiconductive region and close to the insulating region).

Initial research involved iodine doped poly(acetylene) yielding electrical conductivities of up to $10^3$ S/cm (see Shirakawa et al., Chiang et al., (1977); and Chiang et al., (1978)). Improved conductivities of $10^4$ S/cm and $10^5$ S/cm were reported in later studies by Naarmann and Theophilou in Synth. Met., 22, 1 (1987) and by Tsukonoto in Adv. Phys., 41, 509 (1992) respectively. A $ClO_4^-$ doped poly(acetylene) with a conductivity of 40,000 S/cm was reported by Park et al., Synthetic Metals, 96, 81 (1998).

Limitations of processibility and thermal/oxidative stability of poly(acetylene) led to studies on other conjugated polymers. Menon et al., Handbook of Conducting Polymers, $2^{nd}$ edition, edited by T. A. Skotheim, R. L. Elsenbaumer and J. R. Reynolds, Marcel Dekker, New York, 1998 summarized the state-of-the-art and noted references showing $PF_6$ doped oriented poly(pyrrole) with an electrical conductivity of $10^3$ S/cm, doped poly(aniline) with electrical conductivity of 300-400 S/cm and regioregular poly(alkylthiophenes) having electrical conductivities approaching $10^3$ S/cm.

Poly(acetylene) is unique among most conducting polymers because it can be either p-doped (acid; electron acceptors) or n-doped (base) to obtain effective conductivities. The conductivity of potassium doped poly(acetylene) has been reported as 4000 S/cm at atmospheric pressure and 8000 S/cm at 10 kbar pressure by K. Vakiparta et al., Phys. Rev. B, 47, 9977 (1993).

Ahlskog et al., J. of Phys.: Condensed Matter, 9, 4145 (1997) reported conductivity values of various doped conjugated polymers as shown below:

| Polymer | Dopant | Conductivity (S/cm) |
| --- | --- | --- |
| Poly(acetylene) | $I_2$ | >5 × $10^4$ |
| Poly(acetylene) | $FeCl_3$ | >2 × $10^4$ |
| Poly(phenylene vinylene) | $AsF_5$ | 300-2400 |
| Poly(phenylene vinylene) | $H_2SO_4$ | 4000-10,000 |
| Poly(pyrrole) | not specified | 300-400 |
| Poly(aniline) | not specified | 250-350 |

A wide variety of dopants have been used to dope various conjugated polymers. Primarily p-type dopants (acid; electron acceptors) have been studied. Acid dopants include mineral acids such as HCl, $HNO_3$, $H_2SO_4$ and organic sulfonic acids including camphor sulfonic acid, lauryl sulfonic acid, dodecyl benzene sulfonic acid, toluene sulfonic acid, 2-acrylamido-2-methyl-1-propane sulfonic acid, methane sulfonic acid, various organic aromatic sulfonic acid dyes and, to a lesser degree, carboxylic acids. Other p-type dopants include $PF_6$, $AsF_5$, $FeCl_3$, $SO_3$, $BF_3$, $MoCl_5$ and $ZnNO_3$. Polymeric dopants include poly(sulfonic acids) such as poly(styrene sulfonic acid), amic acid presursors of polyimides, poly(carboxylic acids) such as poly(acrylic acid). Weaker acids (such as carboxylic acids) generally yield limited electrically conductivity enhancement and are rarely studied. In some cases, the polymers are self-doped such as sulfonated poly(aniline) (SPANI).

Additives have been used to improve the conductivity of doped conjugated polymers. A secondary doping was observed for poly(aniline) with the addition of m-cresol yielding an increase in conductivity and crystallinity of poly(aniline) (see Y. Cao et al. Synth. Met., 48, 91 (1992)). MacDiarmid and Epstein noted that m-cresol is a secondary dopant for camphor sulfonic acid doped poly(aniline) (Synth. Met., 65,103 (1994)). Studies showed that camphor sulfonic acid was only a fair dopant for poly(aniline), and that higher conductivities can be obtained with the addition of m-cresol. Blends of a water soluble precursor to PPV with other water soluble polymers such as poly(ethylene oxide) (PEO), poly(vinyl methyl ether) (PVME), methyl cellulose (MC), hydroxypropyl cellulose (HPC) and poly(vinyl pyrrolidone) (PVP) were compared with PPV (after conversion of the water soluble precursor to PPV and doping with $AsF_5$). 50/50 blends showed increased conductivity over the control PPV for PEO, PVME and HPC blends with PPV. PEO gave the best results with 166 S/cm over the control 26 S/cm (J. B. Schlenoff et al., J. Polym. Sci., Part B: Polym. Phys., 26, 2247(1988)).

Compositions involving mixed dopants have been described by S. H. Kim et al., in J. Appl. Polym. Sci., 83, 2245 (2002). Poly(aniline) coated NOMEX conducting fibers (DuPont, Wilmington, Del.) were evaluated with HCl, camphor sulfonic acid, toluene sulfonic acid, benzene sulfonic acid, dodecylbenzene sulfonic acid and various blends of HCl with the organic sulfonic acids. The researchers observed that conjugated polymers treated with mixed dopants generally gave higher conductivities than conjugated polymers doped with a single dopant.

Blends of doped conjugated polymers with insulating polymers have been disclosed in the literature. Heeger and coworkers have described conductive polymer blends with excellent efficiency (see Y. Cao et al., Appl. Phys. Lett., 60(22), 2711 (1992) and C. Y. Yang et al., Synth. Met., 53, 293 (1993)). Anionic surfactants were employed as dopants for poly(aniline). Mixtures of the surfactant doped poly(aniline) with insulating polymers cast from mutual solvents exhibited threshold conductivities at compositions as low as 1 wt % poly(aniline). The network structure exhibited an inter-connective morphology for the doped poly(aniline) as contrasted to a particulate dispersed structure that would generally be expected. Other polymers including poly(carbonate), poly(sulfone) and poly(ethylene) showed this behavior at low levels of the surfactant doped poly(aniline) addition. Latex blends comprising electrically conductive polymers have been shown to exhibit electrical conductivity at low levels of addition of a doped conjugated polymer.

Segal et al. disclosed that poly(aniline) (PANI) doped with dodecyl benzene sulfonic acid (DBSA) gave a percolation threshold for conductivity as low as 0.5 wt % (J. Appl. Polym. Sci., 79, 760 (2001)).

Conductivity measurements on blends of doped conjugated polymers with other conducting polymers have not been studied before. Several reports discuss the electrical conductivity of "polypyrrole/polyaniline blends" (see S. Sakkopoulos et al., J. Materials Science, 37, 2865 (2002) and G. S. Akundy et al., J. Appl. Polym. Sci., 833, 1970 (2002)). However, it is evident from the preparation procedure of these "blends," that pyrrole and aniline monomers were mixed prior to polymerization, thus the resulting "blends" were most likely copolymers. The conductivity of non-aged samples versus composition exhibited scattered behavior for $FeCl_3$ polymerized samples ($FeCl_3$ was used as a dopant).

A review of conductive polymer blends by DePaoli et al. did not mention any blends of doped conductive polymers (Macromol. Symp. 189, 83 (2002)).

S. K. M. Jonsson et al., Synth. Met., 10361, 1 (2003) disclose effects of solvent and thermal treatment on the conductivity of poly(3,4-ethylenedioxythiophene) doped with poly(styrene sulfonic acid) (PEDOT-PSSA). The researchers found that specific solvents and polyhydric alcohols (e.g., sorbitol) can yield an increase in conductivity up to a factor of 600 over the control PEDOT-PSSA.

Despite the foregoing developments, there is a need in the art for blends that can be cast in aqueous media and films formed from such blends which provide improved conductivity and processibility.

BRIEF SUMMARY OF THE INVENTION

The inventors have discovered that films cast from water dispersed blends of at least two electrically conducting conjugated polymers, whether doped or undoped, exhibit substantially higher electrical conductivity than the combined electrical conductivities of each respective conjugated polymer. These blends, referred to as aqueous blends, exhibit as much as an order of magnitude or more increase in electrical conductivity compared to the combined electrical conductivities of each respective conjugated polymer. This increase in conductivity is also observed after thermal treatment of films at elevated temperatures.

Accordingly, this invention provides an aqueous blend comprising water, a first conjugated polymer having a conductivity of greater than $10^{-7}$ S/cm and a second conjugated polymer having a conductivity greater than $10^{-7}$ S/cm wherein the conductivities of the first conjugated polymer and the second conjugated polymer are measured using a four point probe prior to preparing the aqueous blend.

Another embodiment describes aqueous blends where the first conjugated polymer and the second conjugated polymer are independently selected from a polymer having a backbone selected from the group consisting of poly(acetylene), poly(thiophene), poly(aniline), poly(pyrrole), poly(phenylene), poly(phenylene vinylene), poly(thienyl vinylene), poly(phenylene sulfide), poly(aniline)sulfonate, poly(3,4-ethylenedioxythiophene) and poly(thieno[3,4-b]thiophene).

Another embodiment describes the previously discussed aqueous blends wherein at least one of the first conjugated polymer and the second conjugated polymer is doped with a p-type dopant. Suitable p-type dopants include but are not limited to the group consisting of a halogen, a mineral acid, an organic acid, a poly(sulfonic acid), amic acid precursors of polyimides, a poly(carboxylic acid) and mixtures thereof. Alternately, at least one of the first conjugated polymer and the second conjugated polymer is doped with an n-type dopant.

Another embodiment describes an aqueous blend wherein the first conjugated polymer is poly(aniline)sulfonate and the second conjugated polymer is poly(3,4-ethylenedioxythiophene) doped with poly(styrene sulfonic acid).

Another embodiment describes an aqueous blend wherein the first conjugated polymer is poly(aniline)sulfonate and the second conjugated polymer is poly(pyrrole) doped with an organic acid.

Another embodiment describes an aqueous blend wherein the first conjugated polymer is poly(3,4-ethylenedioxythiophene) doped with poly(styrene sulfonic acid) and the second conjugated polymer is poly(pyrrole) doped with the organic acid.

Another embodiment describes an aqueous blend wherein the first conjugated polymer is poly(aniline)sulfonate and the second conjugated polymer is poly(thieno[3,4-b]thiophene) doped with poly(styrene sulfonic acid).

Another embodiment describes an aqueous blend wherein the first conjugated polymer is poly(3,4-ethylenedioxythiophene) doped with poly(styrene sulfonic acid) and the second conjugated polymer is poly(thieno[3,4-b]thiophene) doped with poly(styrene sulfonic acid).

The aqueous blends of the present invention can be formed by mixing a broad range of weight percentages of the first conjugated polymer and the second conjugated polymer. For example, aqueous blends of the present invention may comprise from 5 wt % to 95 wt % of the first conjugated polymer based on total doped conjugated polymer solids.

The aqueous blends of the present invention may optionally comprise an additive selected from the group consisting of a surfactant, an organic solvent, a poly(hydroxy alcohol), a water miscible polymer, a p-type dopant and mixtures thereof. A broad range of additives can be added to the aqueous blends of the present invention and typically contain from 2 wt % to about 90 wt % of the additive based on total solids. Suitable water miscible polymers include but are not limited to poly(vinyl pyrrolidone), poly(ethylene oxide), poly(acrylic acid) and mixtures thereof.

The present invention also presents a film comprising a first conjugated polymer having a conductivity of greater than $10^{-7}$ S/cm and a second conjugated polymer having a conductivity greater than $10^{-7}$ S/cm formed by (a) depositing onto an article an aqueous blend comprising water, a first conjugated polymer having a conductivity of greater than $10^{-7}$ S/cm and a second conjugated polymer having a conductivity greater than $10^{-7}$ S/cm wherein the conductivities of the first conjugated polymer and the second conjugated polymer are measured using a four point probe method prior to preparing the aqueous blend and (b) removing the water-containing solution to form the film on the article.

In one embodiment, the films of the present invention comprise the first conjugated polymer and the second conjugated polymer which are independently selected from a polymer having a backbone selected from the group consisting of poly(acetylene), poly(thiophene), poly(aniline), poly(pyrrole), poly(phenylene), poly(phenylene vinylene), poly(thienyl vinylene), poly(phenylene sulfide), poly(aniline)sulfonate, poly(3,4-ethylenedioxythiophene), poly(thieno[3,4-b]thiophene) and mixtures thereof.

Another embodiment describes films wherein at least one of the first conjugated polymer or the second conjugated polymer having a conductivity greater than $10^{-7}$ S/cm has been doped with a p-type dopant.

Another embodiment describes films wherein the p-type dopant is selected from the group consisting of a halogen, a mineral acid, an organic acid, a poly(sulfonic acid), amic acid precursors of polyimides, a poly(carboxylic acid) and mixtures thereof. Alternately, at least one of the first conjugated polymer or the second conjugated polymer of the films of this invention may be doped with one or more conventional n-type dopants well known in the art.

Another embodiment describes films wherein the first conjugated polymer is poly(aniline)sulfonate and the second conjugated polymer is poly(3,4-ethylenedioxythiophene) doped with poly(styrene sulfonic acid).

Another embodiment describes films wherein the first conjugated polymer is poly(aniline)sulfonate and the second conjugated polymer is poly(pyrrole) doped with an organic acid.

Another embodiment describes films wherein the first conjugated polymer is poly(3,4-ethylenedioxythiophene) doped with poly(styrene sulfonic acid) and the second conjugated polymer is poly(pyrrole) doped with the organic acid.

Another embodiment describes films wherein the first conjugated polymer is poly(aniline)sulfonate and the second conjugated polymer cm is poly(thieno[3,4-b]thiophene) doped with poly(styrene sulfonic acid).

Another embodiment describes films wherein the first conjugated polymer is poly(3,4-ethylenedioxythiophene) doped with poly(styrene sulfonic acid) and the second conjugated polymer is poly(thieno[3,4-b]thiophene) doped with poly(styrene sulfonic acid).

The films of the present invention can be formed by using aqueous blends having a broad range of weight percentages of the first conjugated polymer and the second conjugated polymer. For example, films can be readily formed by using aqueous blends comprising from 5 wt % to 95 wt % of the first conjugated polymer based on total doped conjugated polymer solids.

The films may be formed from blends that optionally comprise an additive selected from the group consisting of a surfactant, an organic solvent, a poly(hydroxy alcohol), a water miscible polymer, a p-type dopant and mixtures thereof. A broad range of additives can be added to the aqueous blends of the present invention and typically contain from 2 wt % to about 90 wt % of the additive based on total solids. Suitable water miscible polymers include but are not limited to poly(vinyl pyrrolidone), poly(ethylene oxide), poly(acrylic acid) and mixtures thereof.

By way of example, the films of the present invention are suitable for use in fabricating electroluminescent devices wherein the film provides the hole injection/transporting layer of the electroluminescent device. Moreover, the films of the present invention are suitable for use in fabricating photovoltaic devices wherein the film provides the hole injection/transporting layer of the photovoltaic device.

BRIEF DESCRIPTION OF SEVERAL VIEWS OF THE DRAWINGS

The invention will be described by way of example with reference to the accompanying drawings, in which.

DETAILED DESCRIPTION OF THE INVENTION

Figure 1:
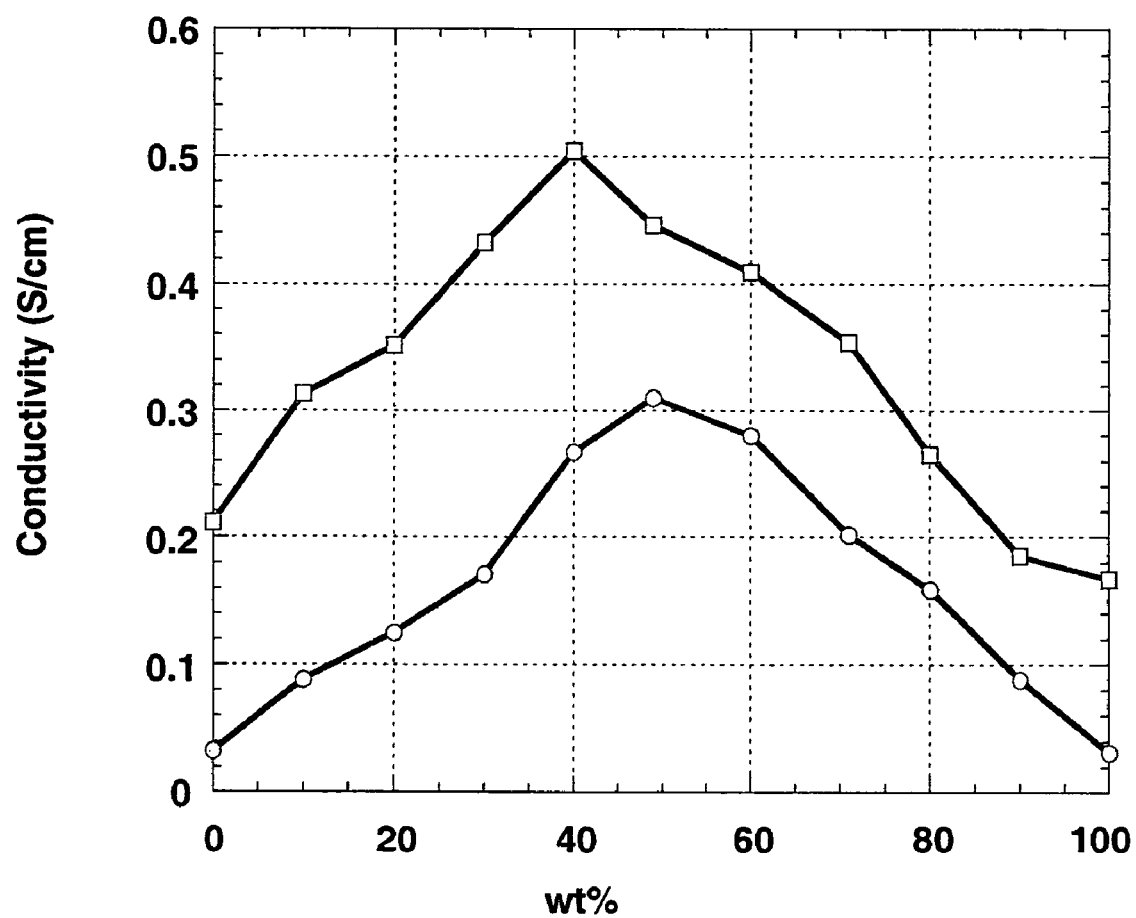
FIG. 1 is a graph demonstrating conductivity of films cast from an aqueous blend of sulfonated poly(aniline) (SPANI) and poly(3,4-ethylenedioxythiophene) (PEDOT) doped with poly(styrene sulfonic acid) (PSSA) as a function of wt % of PEDOT. Films spin coated at room temperature are shown herein by open circles, and films annealed at 200° C. for 2 min are shown using open squares.

The present invention provides novel blend of at least two electrically conducting conjugated polymers wherein the blends reside in water instead of non-aqueous media. The inventors have discovered that blending at least two water based electrically conducting conjugated polymers having conductivity greater than $10^{-7}$ S/cm can yield a synergistic blend having an enhanced conductivity over the weight averaged values of the unblended electrically conducting conjugated polymers. Thus, the invention provides a composition comprising a water-based blend of at least two conducting polymers, wherein each of the least two conducting polymers when cast as a film has a conductivity of greater than $10^{-7}$ S/cm. In certain embodiments, at least one of the electrically conducting conjugated polymers is a doped derivative of a conjugated polymer.

When two or more substances in a combination demonstrate an unexpectedly high increase of a known parameter in comparison with the weight averaged value of such parameter of respective substances (components), the resulting phenomenon may be referred to as synergism. The expected value of a property (i.e., conductivity) from a blend of two components would be the weight averaged value. In a blend comprising a component "a" and a component "b" having properties P(a) and P(b) and weight fractions w(a) and w(b) of the respecting components, the weight averaged value of the property of the components P(Δ) can be expressed as follows:

$$P(\Delta) = w(a)P(a) + w(b)P(b)$$

If the experimental value for the property of the blend is higher than the weight averaged value of the property of components, then the behavior is considered synergistic.

The term "synergism," as used in this application designates an increase in electrical conductivity encountered in combining at least two components, electrically conducting conjugated polymers, whether doped or undoped, to form an aqueous blend in which the conductivity of a film cast from the aqueous blend significantly (as much as an order of magnitude) exceeds the weight averaged value of the components (i.e., the respective electrically conducting conjugated polymers).

Conjugated polymers generally show electrical conductivity in the semi-conductive range from about $10^{-7}$ to about $10^{-1}$ S/cm. With doping, the electrical conductivity can dramatically increase to $10^{-3}$ to about $10^3$ S/cm.

Dopants

The term "dopant" as used in herein means a substance capable of changing the electronic, optical, magnetic and/or structural properties of the polymer as evidenced by an increase in a specific property such as electrical conductivity. In specific cases these increases can be several orders of magnitude as is the case with the conductivity of the electrically conducting conjugated polymers of this invention.

Non-limiting examples of dopants useful in this invention include mineral acids such as HCl, $HNO_3$, $H_2SO_4$, and organic acids. Non-limiting examples of organic acids include organic sulfonic acids such as camphor sulfonic acid, lauryl sulfonic acid, dodecyl benzene sulfonic acid, toluene sulfonic acid, 2-acrylamido-2-methyl-1-propane sulfonic acid, methane sulfonic acid, various organic aromatic sulfonic acid dyes, and, to a lesser degree, carboxylic acids. Other p-type dopants include $PF_6$, $AsF_5$, $FeCl_3$, $SO_3$, $BF_3$, $MoCl_5$ and $ZnNO_3$. Polymeric dopants include poly(styrene sulfonic acid), poly(sulfonic acid), amic acid presursors of polyimides, poly(carboxylic acids) such as poly(acrylic acid). In some cases, the resultant doped conjugated polymers are water soluble or water dispersible. Specific cases include sulfonated polyaniline, sulfonated polypyrrole and polythiophene derivatives polymerized in the presence of organic sulfonic acids.

Conjugated Polymers

The electrically conducting conjugated polymers of this invention are polymers with repeating units comprising alternating single bond and double bond structures. For example, phenylene, thiophene and pyrrole units exhibit such conjugation either as repeat units or copolymers with vinylene units. Poly(aniline) exhibits conjugation with the emeraldine structure. Conjugated polymers used in the invention are capable of an increase in conductivity to at least three orders of magnitude after doping with a dopant. Conjugated polymers used in the invention are polymers capable of forming a water-based solution, a dispersion, an emulsion or a colloidal substance.

Non-limiting examples of conjugated polymers useful in this invention include poly(acetylene), poly(thiophene), poly(aniline), poly(pyrrole), poly(phenylene), poly(phenylene vinylene), poly(thienyl vinylene) and poly(phenylene sulfide) and derivatives thereof.

The electrically conducting conjugated polymers of this invention possess a backbone from which conventional substituents may be added. Thus, the term, backbone refers to the most basic building block of the polymer from which the backbone can be derivatized by adding known substituents. By way of example, alkyl groups can be added to the backbone of the polymer to form an alkylated polymer. Likewise, the polymer backbone can be formed from conventional isomers of each corresponding monomer. For example poly (phenylene vinylene) can be prepared by polymerizing para phenylene vinylene or metal phenylene vinylene. Therefore, the term, polymer backbone, encompasses substituted and non-substituted structures.

The electrically conducting conjugated polymers can be prepared by conventional methods known in the art. For example, poly(acetylene) can be prepared by methods described by Shirakawa et al., supra, from acetylene in the presence of a Zeigler catalyst or using a different catalyst such as $Ti(OC_4H_9)_4/Al(C_2H_5)_3$ in a silicone oil as described by Naarmann et al., supra.

Electrically conducting conjugated polymers can also be prepared by electrochemical polymerization of monomers. For example, poly(pyrrole) was prepared as described by DePaoli et al., supra, by electrochemical polymerization of pyrrole in poly(vinyl chloride), PVC, modified platinum electrode.

A preferred electrically conducting conjugated polymer is poly(3,4-ethylenedioxythiophene) (PEDOT) prepared in the presence of poly(styrene sulfonic acid) as a dopant as described in U.S. Pat. No. 5,300,575 to Jonas et al.

Another preferred electrically conducting conjugated polymer is poly(thieno-[3,4-b]-thiophene) (PTT) in a water dispersion with poly(styrene sulfonic acid) (PSSA) as a dopant. PTT can be prepared by electrochemical polymerization of thieno[3,4-b]thiophene as described by works of Gregory A Sotzing et al. (see G. A. Sotzing and K. Lee, Macromolecules, 35, 7281(2002); K. Lee and G. A. Sotzing, Macromolecules, 34, 5746(2001); V. Seshadri, L. Wu and G. A. Sotzing, Langmuir, 19, 9479(2003); V. Seshadri, K. Lee and G. A. Sotzing, Polymer Preprints, 43(2), 584(2002); and L. Lee and G. A. Sotzing, Polymer Preprints, 43(2), 610 (2002).

Aqueous dispersions of PTT:PSSA can be prepared by oxidative polymerization of thieno[3,4-b]thiophene monomer in the presence of PSSA and an oxidant such as, for example, ferric sulfate hydrate as described in Example 4 below.

Blends

Blends of the invention can be prepared simply by mixing water-borne solutions, dispersions or suspensions of at least two electrically conducting conjugated polymers (e.g., a first conducting polymer and a second conducting polymer). In certain embodiments, a water-based dispersion or suspension of a first conducting polymer is mixed with a water-based dispersion or suspension of a second conducting polymer to form the aqueous blends of the invention. In certain embodiments, one of the conducting polymers could be added as a solid to the aqueous dispersion/solution of another electrically conducting conjugated polymer. In certain embodiments, solid electrically conducting conjugated polymers are mixed and then dissolved or dispersed in water.

More than two electrically conducting conjugated polymers can be blended. Blends of the invention shall mean water solutions, water dispersions, colloids, or water emulsions of the subject electrically conducting conjugated polymers.

In certain embodiments, each of the at least two electrically conducting conjugated polymers is a doped derivative of a conjugated polymer as described above.

Conductivity of films cast from compositions of the invention may broadly vary based on a ratio of desired conducting polymers. In certain embodiments, at least one electrically conducting conjugated polymer of the aqueous blend is blended at a concentration of 5 wt % to 95 wt of the first electrically conducting conjugated polymer based on total doped conjugated polymer solids. The term, solids, refers to the amount of all compositions of matter blended in water. Thus, the term, total doped conjugated polymer solids, refers to the sum of all doped conjugated polymers in the blend. Therefore, the term, total doped conjugated polymer solids excludes conjugated polymers in the undoped state, additive solids and solids of polymers that are not electrically conducting conjugated polymers.

Blends can be applied to various articles including glass, plastics, metals, silicon wafers, films, fibers and the like. Representative articles include electroluminescent devices and photovoltaic devices. Blends can be applied by spin coating, meniscus coating, ink jet printing, screen printing, roll-to-roll printing, spray coating, brush coating, microcontact printing digital printing and the like to form films or coatings.

The resultant coated articles can be further treated with heat, an organic solvent (vapor or immersion), irradiated (e.g. by UV) or exposed to reactive gases ($I_2$ vapor, $Cl_2$, $F_2$, $SO_2$, etc.). Blends can be further modified (e.g., by immersion) with dopants in proper organic or aqueous solutions/dispersions.

In certain embodiments, the composition of the invention is in a form of a film or coating. For purposes of this invention, the term, film, shall possess a broad definition encompassing any coating or deposit of the films of the present invention regardless of thickness, shape or structure. In certain embodiments, the thickness is at least 5 nm. Films can be formed by depositing a monomolecular layer of the composition. Several layers of the same or different compositions are also contemplated herein.

The films of the present invention can completely cover a surface of a desired article, or a portion thereof (e.g., continuous coatings, including those that form films on the surface), as well as coatings that may only partially cover a surface, such as those coatings that after drying leave gaps in coverage on a surface (e.g., discontinuous coatings). The later category of coatings may include, but is not limited to, a network of covered and uncovered portions and distributions of deposits of the composition of the invention on a surface, which may have spaces between the deposits. In the case of conductive networks, a grid of lines of a conducting polymer blend may be applied to a surface forming a pattern. In some embodiments, the coating preferably forms at least one layer of the composition of the invention on the surface, which has been coated, and is substantially uniform. However, when the coatings described herein are described as being applied to a surface, it is understood that the coatings need not be applied to, or that they cover the entire surface. For instance, the coatings will be considered as being applied to a surface even if they are only applied to modify a portion of the surface.

The aqueous blends of the present invention can be further modified by addition of an additive to the blend or to components of the blend. The additives can be employed for various purposes such as stabilization or further enhancement of electrical conductivity. In certain embodiments, the additive is selected from the group consisting of a surfactant (ionic and non-ionic), an organic solvent, a poly(hydroxy alcohol), a water miscible polymer, and a dopant. In certain embodiments, the additive is blended in an additive amount of from 2 wt % to about 90 wt % based on total solids. The term, total solids, refers to all solids in the aqueous blend.

The non-ionic surfactants include ethoxylated alkyl phenols and ethylene oxide/propylene oxide block copolymers. Protective colloids can also be employed as is or in admixtures with other surfactants. The preferred protective colloids are poly(vinyl alcohol) and hydroxyethylcellulose. Water miscible organic solvents can be added including N-methyl pyrrolidone, dimethyl sulfoxide, dimethylacetamide, dimethylformamide, formamide, acetonitrile, methanol, ethanol, isopropanol, tetrahydrofuran, acetone and the like. Other miscible organic compounds such as ethylene glycol, diethylene glycol, sorbitol, glycerol, threitol, arabitol and other poly (hydroxy alcohols) can be added. Water miscible polymers such as poly(vinyl pyrrolidone), poly(ethylene oxide) and poly(acrylic acid) can also be added to the aqueous solutions/dispersions of the conducting polymers of this invention.

Another way of further enhancing conductivity of the film cast from the composition of the invention is by heating or annealing. The film can be heated to at least a glass transition temperature of at least one of the first conducting polymer and the second conducting polymer to thereby further enhance the conductivity by at least 10% depending on the wt % of the blend. This is demonstrated in FIGS. 1-3, which showed further enhancement of conductivity by annealing at 200° C. as compared to conductivity of films cast from various blends at room temperature.

Method of Making the Composition of the Invention

A method of making the composition of the invention includes providing a first conjugated polymer having an electrical conductivity of greater than $10^{-7}$ S/cm, providing a second conjugated polymer having an electrical conductivity of greater than $10^{-7}$ S/cm and mixing the first conducting polymer and the second conducting polymer in water to form the water-based (aqueous) blend and thereby making the composition. Preferably, the composition of the invention is formed by mixing water based dispersions or solutions of each individual conducting polymer. The resultant based water based dispersion or solution can be cast into a film, a shape or a coating and dried to yield a solid material which is electrically conductive.

In certain embodiments of the method, each of the first electrically conducted conjugated polymer and the second electrically conducting conjugated polymer is doped with one or more enumerated dopants prior to forming the aqueous blend.

In certain embodiments of the method, the dopant is a member selected from the group consisting of a halogen, a mineral acid, and an organic acid such as, for example, an organic sulfonic acid, an organic aromatic sulfonic acid dye, a carboxylic acid. The dopant can also be a polymer such as, for example, a poly(styrene sulfonic acid), a poly(sulfonic acid), amic acid presursors of polyimides, and a poly(carboxylic acid).

In certain embodiments of the method, the dopant is a member selected from the group consisting of $I_2$, $SO_2$, $SO_3$, $PF_6$, $AsF_5$, $FeCl_3$, $BF_3$, $MoCl_5$, $ZnNO_3$, $HCl$, $HNO_3$ or $H_2SO_4$.

In certain embodiments of the method, the first conjugated polymer and the second conjugated polymer is independently selected from the group consisting of poly(thiophene), poly (aniline), poly(pyrrole), poly(phenylene), poly(phenylene vinylene), poly(thienyl vinylene) and poly(phenylene sulfide).

In certain embodiments, the method further comprises providing an additive selected from the group consisting of a surfactant, an organic solvent, a poly(hydroxy alcohol), a water miscible polymer, and an additional dopant as described above. The additional dopant can be the same or different from the dopant already used.

Applications of the Aqueous Blends of the Invention

The aqueous blends of the invention can be employed in numerous applications. These applications include but are not limited to electromagnetic shielding, antistatic coatings, electroluminescent devices, photovoltaic devices, electrochromic devices, touch and memory screens, field effect transistors, plastic electronics, solid electrolyte capacitors, anticorrosion coatings, battery electrodes, transparent heating films, sensors, electrically conductive adhesives, and photo-imageable conductive polymers. For purposes of this invention, these applications shall be referred to as articles.

The aqueous blends of the invention can be conveniently added to water borne dispersions, emulsions or suspensions of other polymers to yield semi-conductive or conductive materials such as conductive adhesives or coatings. Blends with typical emulsions (such as acrylate or vinyl acetate based emulsions) can be employed as coatings with antistatic properties.

A non-limiting example of the application of the composition of the invention is its use as a hole injection/transporting layer for light emitting diodes. Surprisingly, it has now been found that the films derived from compositions of the invention exhibit improved performance in LED devices.

An exemplary electroluminescent device comprises an anode, a cathode, a hole injection/transporting layer comprising a film cast from the composition of the invention, wherein the hole injection/transporting layer is in communication with the anode, and a light emitting layer disposed between the hole injection/transporting layer and the cathode.

The construction of light emitting devices can be greatly varied. For example, suitable light emitting devices can have a transparent anode placed on one side of an appropriate substrate. A hole injection/transport layer is placed on top of the transparent anode as described in a pending patent application entitled "NOVEL LIGHT EMITTING LAYERS FOR LED DEVICES BASED ON HIGH $T_g$ POLYMER MATRIX COMPOSITIONS", having the application Ser. No. 10/253,108 and filed on Sep. 23, 2002. On top of the hole injection/ transport layer is the light emitting layer where holes and electrons combine to emit light, wherein the light emitting layer is in communication with the cathode.

Figure 4:
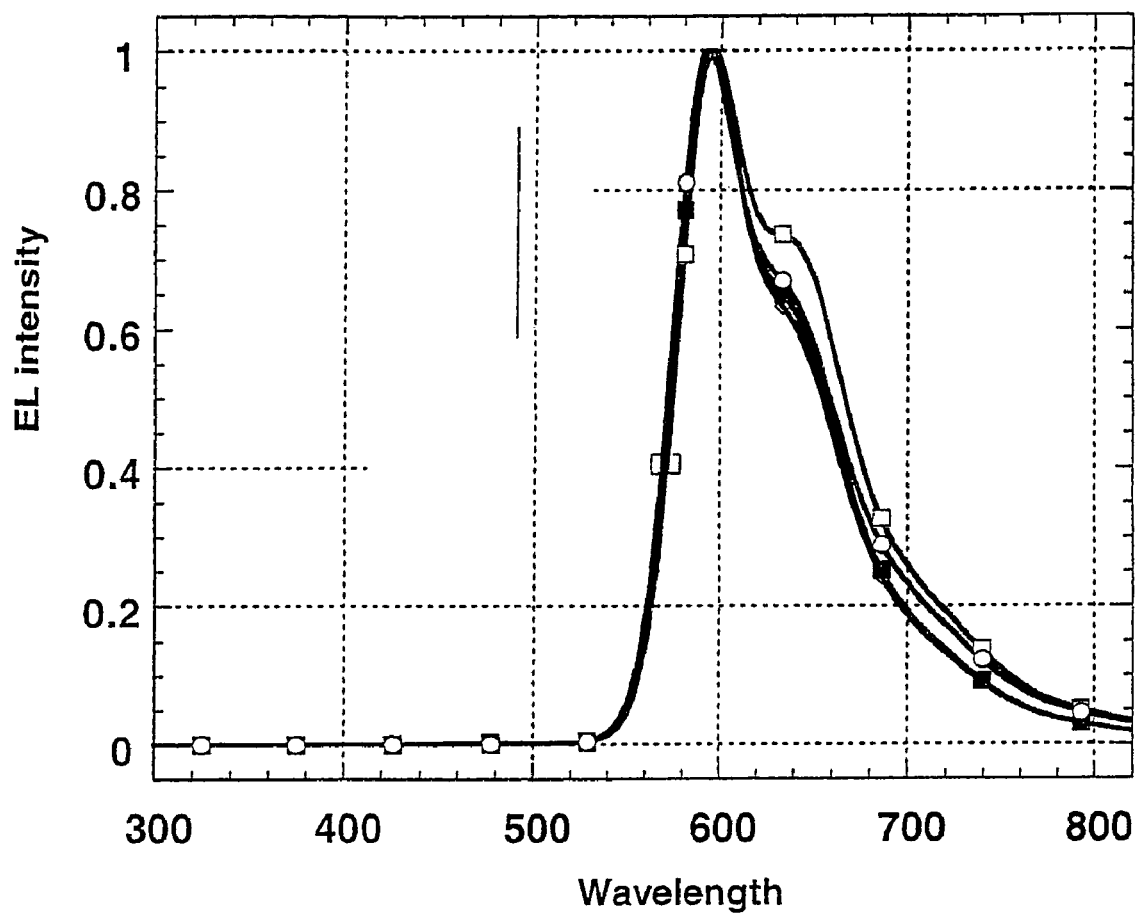
FIG. 4 is a graph demonstrating electroluminescence (EL) spectra of electroluminescent devices having various hole injection/transport layers such as (1) PTT doped with PSSA, (2) PEDOT doped with PSSA and blended with PTT doped with PSSA, and (3) PEDOT doped with PSSA in combination with indium tin oxide as an anode and MEH-PPV as a light emitting layer at 6 V forward bias. A control sample had no hole injection/transport layer and is labeled therein as "none." Hole injection/transport materials are labeled as follows: PTT:PSSA is shown as open squares, ((PEDOT:PSSA):(PTT:PSSA)) is shown as filled squares, PEDOT:PSSA is shown as open diamonds, and the control having no hole injection/transport layers is shown as open circles.

Inventors have discovered that a hole injection/transport layer allows for improved performance of light emitting diode devices such as, for example, an improved quantum efficiency and brightness as demonstrated in Table 5 and FIG. 4. PEDOT:PSSA is often employed as the hole injection/ transport layer in these devices in prior art. It has been surprisingly found that blends of aqueous based conducting polymers (one of which is PEDOT:PSSA) display synergisitic behavior when employed as the hole injection/transport layer.

Typically the substrate coated with the anode is glass. Transparent polymer sheets and films can also be employed. These include, e.g., Bisphenol A polycarbonate, PMMA, poly(ethylene terephthalate) film, poly(sulfone) films, poly(propylene) films and the like.

The transparent anode is preferably indium-tin oxide (ITO), tin oxide or doped zinc oxide. Conductive polymeric materials can be used as the anode or as a coating on the anode to improve the hole injection. In some cases, the cathode is transparent which allows for a larger aperture in active matrix displays.

Similar constructions are possible for photovoltaic devices wherein the light emitting layer is a light harvesting layer. In photovoltaic devices, adsorption of incident light energy is converted into electrical energy. Placement of hole injection/ transport layers on the anode improved performance of the device as described in a pending patent application entitled "PHOTOVOLTAIC DEVICES COMPRISING LAYER(S) OF PHOTOACTIVE ORGANICS DISSOLVED IN HIGH $T_g$ POLYMERS", having the application Ser. No. 10/630,279 and filed on Jul. 29, 2003.

An exemplary photovoltaic device comprises an anode, a cathode, a hole injection/transporting layer comprising the composition of the invention as a film, wherein the hole injection/transporting layer is in communication with the anode, and a light harvesting layer disposed between the hole injection/transporting layer and the cathode.

Composition of the invention offers improved performance in the photovoltaic device over that of the unblended components.

The invention will be illustrated in more detail with reference to the following Examples, but it should be understood that the present invention is not deemed to be limited thereto.

EXAMPLE 1

Blends of SPANI and PEDOT

Blends of SPANI (5 wt % water dispersion from Aldrich Chemical Co., Inc. Milwaukee, Wis., CAS# 167860-86-8) and BAYTRON P V4071 PEDOT (0.5 wt % PEDOT and 0.8 wt % PSSA in water; from Bayer Corp., Pittsburg, Pa.) (PEDOT:PSSA) were prepared by mixing SPANI dispersion and PEDOT:PSSA dispersion at the weight ratios listed in Table 1. Films were then spin coated onto glass substrates using the blends at a spin rate of 600 rpm. For comparison, films of SPANI and PEDOT:PSSA were also spun coated under the same condition. The conductivities were measured using a Signatone four point probe (Signatone Corp, Gilroy, Calif.) in combination with a Keithley 2400 SourceMeter (Keithley Instruments Inc., Cleveland, Ohio). The four-point probe method is well known in the art and shall be given its ordinary definition as set forth in the art. The films were then annealed at 200° C. for 2 min under nitrogen protection, and the conductivities were measured again. Thickness of the films was measured using a KLA Tencor P-15 profilometer (KLA Tencor Corp., San Jose, Calif.).

Figure 2:
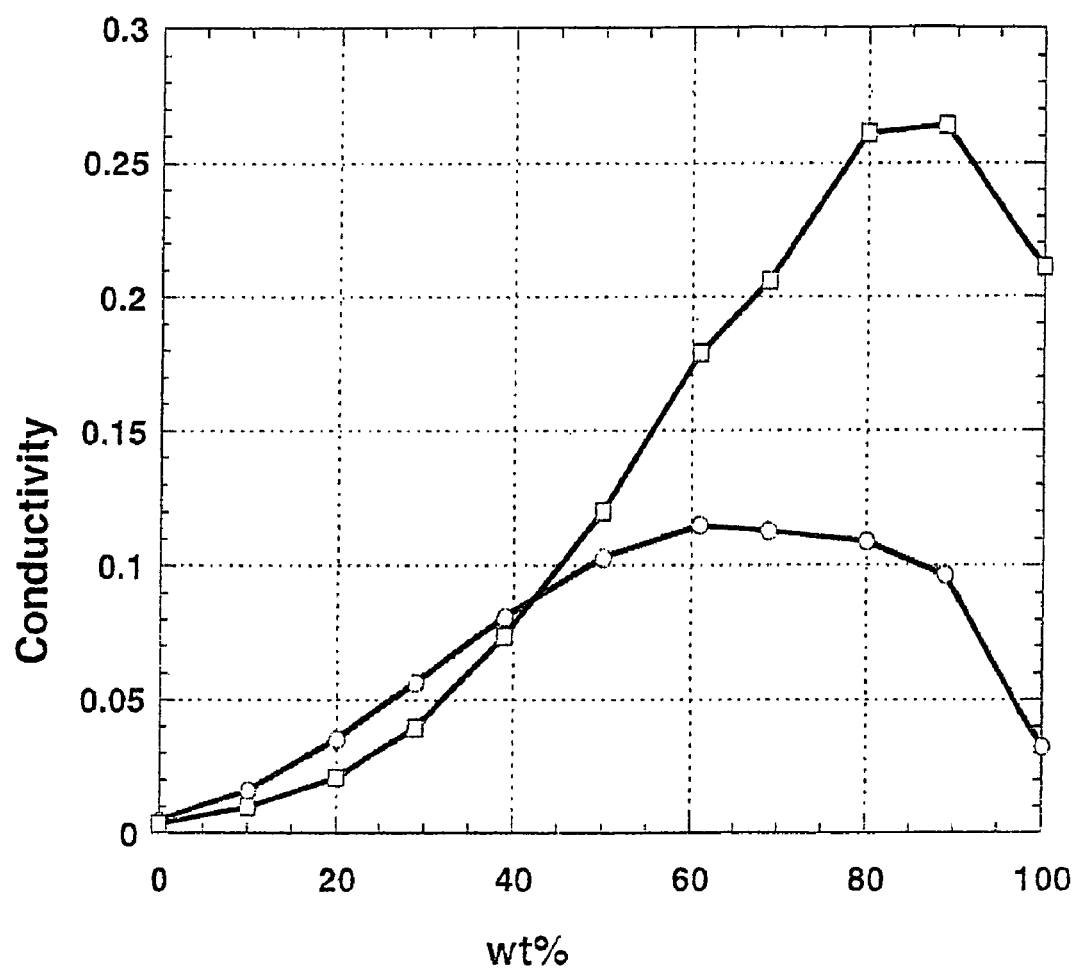
FIG. 2 is a graph demonstrating conductivity of films cast from the blend of SPANI and poly(pyrrole) (PPy) doped with an organic acid as a function of wt % of SPANI. Films spin coated at room temperature are shown herein by open circles, and films annealed at 200° C. for 2 min are shown using open squares.

Table 1 summarizes the results for the SPANI:(PEDOT: PSSA) blends at different weight ratios of the two conductive polymers. All of the blend films showed higher conductivity than that of the weight averaged value of the two components. For the as spun films, enhancement in conductivity up to almost 10 times was observed, while enhancement of about 3 times was observed for the annealed film. FIG. 1 shows the conductivity of the blend films at different weight ratios of the components.

TABLE 1

Conductivities of SPANI, PEDOT and their blend films

| SPANI dispersion (g) | PEDOT dispersion (g) | Film Composition (wt % of PEDOT) | Conductivity ($\sigma$) of a spun film (S/cm) | Conductivity ($\sigma$) after annealing (S/cm) |
|---|---|---|---|---|
| 1.00 | 0 | 0 | 3.24E−02 | 2.11E−01 |
| 1.00 | 0.462 | 10 | 8.87E−02 | 3.13E−01 |
| 1.00 | 0.968 | 20 | 1.25E−01 | 3.52E−01 |
| 0.504 | 0.835 | 30 | 1.71E−01 | 4.32E−01 |
| 0.497 | 1.30 | 40 | 2.67E−01 | 5.04E−01 |
| 0.275 | 1.10 | 49 | 3.10E−01 | 4.46E−01 |
| 0.253 | 1.46 | 60 | 2.80E−01 | 4.09E−01 |
| 0.205 | 1.91 | 71 | 2.02E−01 | 3.54E−01 |
| 0.125 | 1.95 | 80 | 1.59E−01 | 2.65E−01 |
| 0.0495 | 1.73 | 90 | 8.86E−02 | 1.85E−01 |
| 0 | 1.00 | 100 | 3.12E−02 | 1.67E−01 |

EXAMPLE 2

Blends of SPANI and Doped Poly(Pyrrole) (PPy)

Blends of SPANI (5 wt % water dispersion from Aldrich, CAS# 167860-86-8) and PPy doped with organic acids (OA) (5 wt % dispersion in water from Aldrich, CAS# 30604-81-0) (PPy:OA) were prepared by mixing SPANI dispersion and PPy:OA dispersion at the weight ratios listed in Table 2. Films were then spin coated onto glass substrates using the blends at a spin rate of 600 rpm. For comparison, films of SPANI and PPy:OA alone were also spun coated under the same condition. The conductivities were measured using a Signatone four point probe in combination with a Keithley 2400 SourceMeter. The films were then annealed at 200° C. for 2 min under nitrogen protection, and the conductivities were measured again. Thickness of the films was measured using a KLA Tencor P-15 profilometer. The results are presented in Table 2 and in FIG. 2. The enhancement in conductivity of both as spun and annealed films is demonstrated.

EXAMPLE 3

Blends of PEDOT:PSSA and PPy:OA

Figure 3:
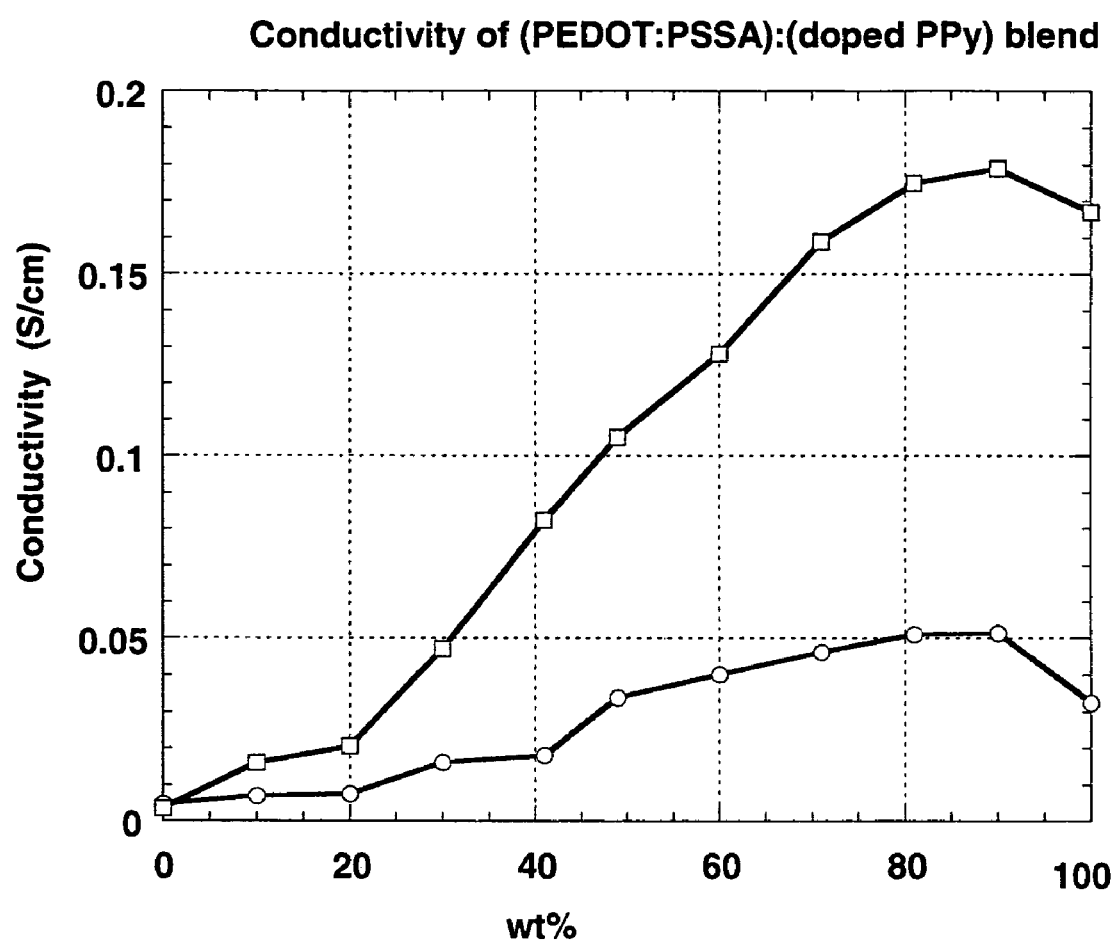
FIG. 3 is a graph demonstrating conductivity of films cast from the blend of PEDOT doped with PSSA and PPy doped with an organic acid as a function of the wt % of PEDOT. Films spin coated at room temperature are shown herein by open circles, and films annealed at 200° C. for 2 min are shown using open squares.

Blends of Baytron P V4071 PEDOT (0.5 wt % PEDOT and 0.8 wt % PSSA in water; from Bayer Corp.) (PEDOT:PSSA) and PPy doped with organic acids (PPy:OA) (5 wt % dispersion in water from Aldrich, CAS# 30604-81-0) were prepared by mixing PEDOT:PSSA dispersion and PPy:OA dispersion at the weight ratios listed in Table 3. Films were then spin coated onto glass substrates using the blends at a spin rate of 600 rpm. For comparison, films of PEDOT:PSSA and PPy:OA were also spun coated under the same condition. The conductivities were measured using a Signatone four point probe in combination with a Keithley 2400 SourceMeter. The films were then annealed at 200° C. for 2 min under nitrogen protection, and the conductivities were measured again. Thickness of the films was measured using a KLA Tencor P-15 profilometer. Table 3 summarizes the results. FIG. 3 graphically represents the results.

TABLE 2

Conductivities of SPANI and PPy:OA, and their blend films

| PPy:OA dispersion(g) | SPANI dispersion (g) | Film Composition (wt % of SPANI) | Conductivity ($\sigma$) of a spun film (S/cm) | Conductivity ($\sigma$) after annealing (S/cm) |
|---|---|---|---|---|
| 1.00 | 0 | 0 | 4.68E−03 | 3.56E−03 |
| 0.941 | 0.107 | 10 | 1.61E−02 | 9.78E−03 |
| 0.802 | 0.198 | 20 | 3.54E−02 | 2.07E−02 |
| 0.752 | 0.311 | 29 | 5.65E−02 | 3.95E−02 |
| 0.647 | 0.415 | 39 | 8.10E−02 | 7.37E−02 |
| 0.506 | 0.500 | 50 | 1.03E−01 | 1.20E−01 |
| 0.396 | 0.608 | 61 | 1.15E−01 | 1.79E−01 |
| 0.313 | 0.694 | 69 | 1.13E−01 | 2.06E−01 |
| 0.197 | 0.805 | 80 | 1.09E−01 | 2.61E−01 |
| 0.118 | 0.934 | 89 | 9.68E−02 | 2.64E−01 |
| 0 | 1.00 | 100 | 3.24E−02 | 2.11E−01 |

TABLE 3

Conductivities of PEDOT and PPy, and their blend films

| Ppy:OA dispersion (g) | PEDOT:PSSA Dispersion (g) | Film Composition (wt % of PEDOT:PSSA) | Conductivity ($\sigma$) of a spun film (S/cm) | Conductivity ($\sigma$) after annealing (S/cm) |
|---|---|---|---|---|
| 1.00 | 0 | 0.0 | 4.68E−03 | 3.56E−03 |
| 1.00 | 0.429 | 10 | 6.97E−03 | 1.61E−02 |
| 1.02 | 0.984 | 20 | 7.50E−03 | 2.06E−02 |
| 0.536 | 0.886 | 30 | 1.63E−02 | 4.71E−02 |
| 0.503 | 1.33 | 41 | 1.81E−02 | 8.22E−02 |
| 0.266 | 0.973 | 49 | 3.38E−02 | 1.05E−01 |
| 0.264 | 1.50 | 60 | 4.01E−02 | 1.28E−01 |
| 0.206 | 1.98 | 71 | 4.63E−02 | 1.59E−01 |
| 0.137 | 2.19 | 81 | 5.11E−02 | 1.75E−01 |
| 0.053 | 1.89 | 90 | 5.15E−02 | 1.79E−01 |
| 0 | 1.00 | 100 | 3.12E−02 | 1.67E−01 |

EXAMPLE 4

Blends of SPANI and Doped Poly(Thieno[3,4-b]Thiophene) (PTT:PSSA)

Blends of SPANI (5 wt % water dispersion from Aldrich, CAS# 167860-86-8) and PTT (a water dispersion of 0.5 wt % PTT and 0.8 wt % PSSA) (PTT:PSSA) were prepared by mixing SPANI dispersion and PTT:PSSA dispersion at the weight ratios listed in Table 4. PTT:PSSA dispersion in water was made by oxidation polymerization of PTT, wherein 99 mg (0.706 mmol) of thieno[3,4-b]thiophene and 863 mg of 30% poly(styrene sulfonic acid) water solution in 20.0 g of de-ionized water was added to a 50 cc two-neck reaction flask. 322.8 mg of ferric sulfate hydrate was added to the reaction flask with stirring using a Turrax T-8 Rotor stator (GENEQ Inc., Montreal, Quebec, Canada) at 12,000 rpm while maintaining stirring. The oxidation polymerization was carried in excess of 1 hour. After polymerization, the aqueous solution was purified by ion exchange columns LEWATIT K-2621 and K-7333 (Bayer Corp., Pittsburg, Pa.) resulting in a deep green-blue aqueous poly(thieno[3,4-b]thiophene): poly(styrenesulfonic acid) dispersion.

Next, films were formed from blends by spin coating onto glass substrates at a spin rate of 600 rpm. For comparison, films of each SPANI and PTT:PSSA were also spun coated under the same condition. The conductivities were measured using a Signatone four point probe in combination with a Keithley 2400 SourceMeter. Thickness of the films was measured using a KLA Tencor P-15 profilometer.

TABLE 4

Conductivities of PTT:PSSA, SPANI and their blend films

| SPANI Dispersion (g) | PTT:PSSA Dispersion (g) | Film Composition (wt % of PTT:PSSA) | Conductivity ($\sigma$) of a spun film (S/cm) |
|---|---|---|---|
| 1.00 | 0 | 0.0 | 3.24E−02 |
| 0.518 | 0.509 | 26 | 5.35E−02 |
| 0.179 | 0.680 | 58 | 4.35E−02 |
| 0.084 | 0.676 | 74 | 3.04E−02 |
| 0 | 1.00 | 100 | 1.39E−02 |

EXAMPLE 5

Hole Injection/Transporting Layer in an Led Device Utilizing Blends of PEDOT:PSSA with PTT:PSSA Films made from blends of at least two conductive polymers exhibit synergism not only as enhanced conductivity, but also as improved performance in device related applications. This example demonstrates an application such as a hole injection/transporting layer for light emitting diodes.

A blend of electronic grade PEDOT:PSSA and PTT:PSSA was prepared by mixing 0.5 mL of BAYTRON P A14083 PEDOT from H. C. Starck and 0.5 mL of PTT:PSSA dispersion (0.5 wt % of poly(thieno[3,4-b]thiophene) with 1.3 wt % of poly(styrene sulfonic acid) in water, made in house as described in Example 4). The blend ((PEDOT:PSSA): (PTT:PSSA)) is hereafter referred to as Blend A. A solution of poly(2-methoxy, 5-(2'-ethyl-hexyloxy)-p-phenylene-vinylene) (MEH-PPV, from American Dye Sources, Inc., Baie D'Urte, Quebec, Canada) was prepared by dissolving 12 mg of MEH-PPV in 2.0 g of toluene and then filtered with a 1.0 μm filter. The solution is hereafter referred as Solution B.

Four polished soda lime float glass (2.5×2.5×0.7 cm) substrates coated on one side with indium tin oxide (resistance ~12 Ω/square) were cleaned by ultrasonication sequentially in detergent, de-ionized water, methanol, isopropanol, and acetone; each for 5 min. The ITO coated glass substrates were allowed to dry between different cleaning solvents. Then the ITO substrates were treated with oxygen plasma in an SPI Prep II plasma etcher (Structure Probe/SPI Supplies Inc, West Chester, Pa.) for about 7 min. Three of the four ITO substrates were then spin coated with electronic grade PTT:PSSA at 1000 rpm, Blend A at 1500 rpm, and BAYTRON P AI4083 PEDOT at 3000 rpm, respectively, as hole injection/transporting layer on a WS-400-N6PP spinner (Laurell Technologies, North Whales, Pa.). The thickness of the hole injection/transporting layer was 30 to 40 nm.

The four ITO substrates were then annealed at 200° C. for 3 to 4 min under nitrogen protection. Then a layer of 60 to 65 nm thick MEH-PPV was spin-coated onto the four ITO substrates from Solution B at a spin rate of 1500 rpm. The four samples were then transferred into the chamber of a vacuum evaporator, which was located inside an argon atmosphere glove box. A layer of 20 nm thick calcium (Ca) was vacuum deposited at below $1.7 \times 10^{-7}$ Torr ($2.28 \times 10^{-5}$ Pa) through a mask, and another layer of 100 nm thick silver (Ag) was vacuum deposited on top of Ca as a protecting layer. The active area of each device is about 6.2 mm². The light emitting diodes (LEDs) were then moved out of the glove box for testing in air at room temperature. Thickness was measured on a KLA Tencor P-15 Profiler. Current-voltage characteristics were measured on a Keithley 2400 SourceMeter. Electroluminescence (EL) spectra of the devices were measured using a CCD camera INSTASPEC IV by Oriel Instruments (Stratford, Conn.). The power of EL emission was measured using a 2835-C multi-function optical meter by Newport Corporation (Irwine, Calif.) in conjunction with a calibrated Si photodiode. Brightness was calculated using the EL forward output power and the EL spectra of the devices, assuming Lambertian distribution of the EL emission.

FIG. 4 shows the EL spectra of the four devices, wherein hole injection/transport materials are labeled as follows: PTT:PSSA is shown as open squares, (PEDOT:PSSA): (PTT:PSSA) is shown as filled squares, PEDOT:PSSA is shown as open diamonds, and the control having no hole injection/transport layers is shown as open circles.

Table 5 summarizes the device performance. The device with ((PEDOT:PSSA): (PTT:PSSA)) as the hole injection/transporting layer demonstrates better performance than devices with either PEDOT:PSSA or PTT:PSSA alone as the hole injection/transporting layer.

TABLE 5

Performance figures for LEDs with configuration of ITO/hole injection/transporting layer/MEH-PPV/Ca/Ag.

| Hole injection/transporting material | Turn-on voltage (V) | Maximum external quantum efficiency (%) | Brightness at current density of 100 mA/cm$^2$ (cd/m$^2$) | Brightness at current density of 1000 mA/cm$^2$ (cd/m$^2$) |
|---|---|---|---|---|
| None | 3.4 | 0.55 | 850 | 8740 |
| PTT:PSSA | 3.0 | 0.90 | 1400 | 12500 |
| PEDOT:PSSA | 2.8 | 1.00 | 1780 | 16100 |
| ((PEDOT:PSSA): (PTT:PSSA)) | 2.6 | 1.26 | 2170 | 19800 |

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

We claim:

1. A hole injection or hole transport film for an electronic device comprising at least one dopant, a first conjugated polymer having a conductivity of greater than about $10^{-7}$ S/cm and a second conjugated polymer having a conductivity greater than about $10^{-7}$ S/cm wherein: i) the film has a conductivity which exceeds the weight averaged value of the first and second conjugated polymers when measured using a four point probe method, ii) after annealing the film at a temperature of about 200° C. for 2 minutes in a nitrogen atmosphere, the film has a conductivity which exceeds the weight averaged value of the first and second conjugated polymers; iii) at least one of said first and second polymers comprises a polythiophene, iv) the first conjugated polymer comprises at least one member selected from the group consisting of poly(aniline)sulfonate, and poly(3,4-ethylenedioxythiophene) doped with poly(styrene sulfonic acid), and v) the second conjugated polymer comprises at least one member selected from the group consisting of poly(3,4-ethylenedioxythiophene) doped with poly(styrene sulfonic acid), poly(pyrrole) doped with an organic acid, and poly(thieno[3,4-b]thiophene) doped with poly(styrene sulfonic acid) and the first and second conjugated polymers are independently selected.

2. The film of claim 1 wherein at least one of the first conjugated polymer or the second conjugated polymer having a conductivity greater than about $10^{-7}$ S/cm has been doped with a p-type dopant.

3. The film of claim 1 where the p-type dopant comprises at least one member selected from the group consisting of a halogen, a mineral acid, an organic acid, a poly(sulfonic acid), amic acid precursors of polyimides, a poly(carboxylic acid) and mixtures thereof.

4. The film of claim 1 wherein at least one of the first conjugated polymer or the second conjugated polymer is doped with an n-type dopant.

5. The film of claim 1 wherein the first conjugated polymer comprises poly(aniline)sulfonate and the second conjugated polymer comprises poly(3,4-ethylenedioxythiophene) doped with poly(styrene sulfonic acid).

6. The film of claim 1 wherein the first conjugated polymer having a conductivity of about $10^{-7}$ S/cm comprises poly(3,4-ethylenedioxythiophene) doped with poly(styrene sulfonic acid) and the second conjugated polymer having a conductivity of about $10^{-7}$ S/cm comprises poly(pyrrole) doped with the organic acid.

7. The film of claim 1 wherein the first conjugated polymer having a conductivity of about $10^{-7}$ S/cm comprises poly(aniline)sulfonate and the second conjugated polymer having a conductivity of about $10^{-7}$ S/cm comprises poly(thieno[3,4-b]thiophene) doped with poly(styrene sulfonic acid).

8. The film of claim 1 wherein the first conjugated polymer having a conductivity of about $10^{-7}$ S/cm comprises poly(3,4-ethylenedioxythiophene) doped with poly(styrene sulfonic acid) and the second conjugated polymer having a conductivity of about $10^{-7}$ S/cm comprises poly(thieno[3,4-b]thiophene) doped with poly(styrene sulfonic acid).

9. The film of claim 1 comprising from about 5 wt % to about 95 wt % of the first conjugated polymer having a conductivity of about $10^{-7}$ S/cm based on total doped conjugated polymer solids.

10. The film of claim 1 further comprising an additive comprising at least one member selected from the group consisting of a surfactant, an organic solvent, a poly(hydroxy alcohol), a water miscible polymer, a p-type dopant and mixtures thereof.

11. The film of claim 10 which contains from about 2 wt % to about 90 wt % of the additive based on total solids.

12. The film of claim 11 wherein the additive comprises at least one water miscible polymer selected from the group consisting of poly(vinyl pyrrolidone), poly(ethylene oxide) and poly(acrylic acid).

13. The film of claim 1 wherein the device comprises an electroluminescent device and includes a light emitting layer.

14. The film of claim 1 wherein the device comprises a photovoltaic device and includes a light harvesting layer.

15. A hole injection film comprising at least one dopant, a first conjugated polymer having a conductivity of greater than about $10^{-7}$ S/cm and a second conjugated polymer having a conductivity greater than about $10^{-7}$ S/cm formed by (a) depositing onto an article a blend comprising water, at least one dopant, a first conjugated polymer having a conductivity of greater than about $10^{-7}$ S/cm and a second conjugated polymer having a conductivity greater than about $10^{-7}$ S/cm wherein the first and second polymer are dispersed or dissolved in water and (b) removing the water to form the film on the article; wherein the film has a higher conductivity than the first or second conjugated polymer when measured using a four point probe methods, and wherein the first conjugated polymer comprises poly(aniline)sulfonate and the second conjugated polymer comprises poly(pyrrole) doped with an organic acid.

16. A film formed by a process comprising: (a) depositing onto an article a blend comprising water, a first polymer having a conductivity of greater than about $10^{-7}$ S/cm and a second polymer having a conductivity greater than about $10^{-7}$ S/cm, and (b) removing water to form the film on the article; wherein the first polymer comprises poly(aniline)sulfonate and the second polymer comprises poly(3,4-ethylenedioxythiophene) doped with poly(styrene sulfonic acid); wherein said conductivity is measured using a four point probe method.

17. A film formed by a process comprising: (a) depositing onto an article a blend comprising water, a first polymer having a conductivity of greater than about $10^{-7}$ S/cm and a second polymer having a conductivity greater than about $10^{-7}$ S/cm, and (b) removing water to form the film on the article; wherein the first polymer comprises poly(3,4-ethylenedioxythiophene) doped with poly(styrene sulfonic acid) and the second polymer comprises poly(thieno[3,4-b]thiophene) doped with poly(styrene sulfonic acid); wherein conductivity is measured using a four point probe method.

18. A film formed from a blend comprising water, a first conjugated polymer having a conductivity of greater than about $10^{-7}$ S/cm and a second conjugated polymer having a conductivity greater than about $10^{-7}$ S/cm; wherein the film has a synergistic electrical conductivity over the weight averaged values of the unblended conjugated polymers wherein one of said conjugated polymers comprises a polythienothiophene; and wherein conductivity is measured by using a four point probe method.

19. The film of claim 18 further comprising at least one additive comprising a member selected from the group consisting of poly(vinyl pyrrolidone), poly(ethylene oxide) and poly(acrylic acid).

* * * * *